United States Patent
Lu et al.

(10) Patent No.: US 10,128,034 B2
(45) Date of Patent: Nov. 13, 2018

(54) HEAT DISSIPATION DEVICE

(71) Applicant: DELTA ELECTRONICS, INC., Taoyuan (TW)

(72) Inventors: Chao-Wen Lu, Taoyuan (TW); Chun-Chih Wang, Taoyuan (TW); Ding-Wei Chiu, Taoyuan (TW); Chung-Hung Tang, Taoyuan (TW)

(73) Assignee: Delta Electronics, Inc., Taoyuan (TW)

( * ) Notice: Subject to any disclaimer, the term of this patent is extended or adjusted under 35 U.S.C. 154(b) by 377 days.

(21) Appl. No.: 14/839,587

(22) Filed: Aug. 28, 2015

(65) Prior Publication Data

US 2016/0064131 A1    Mar. 3, 2016

(30) Foreign Application Priority Data

Aug. 29, 2014   (TW) .............................. 103129814 A (51) Int. Cl.
   *H05K 7/20*     (2006.01)
   *H01F 27/08*    (2006.01)
   *H01L 23/427*   (2006.01)

(52) U.S. Cl.
   CPC .......... *H01F 27/085* (2013.01); *H01L 23/427* (2013.01); *H05K 7/20* (2013.01); *H05K 7/20172* (2013.01)

(58) Field of Classification Search
   CPC ..... H05K 7/20172; H05K 7/20; H01L 23/427
   USPC ...... 165/120, 121, 104.33; 417/410.1, 410.2, 417/412, 412.1, 413.2
   See application file for complete search history.

(56) References Cited

U.S. PATENT DOCUMENTS

| | | | | |
|---|---|---|---|---|
| 4,063,826 A * | 12/1977 | Riepe | ...................... | F04D 33/00 417/410.1 |
| 7,619,894 B2 * | 11/2009 | Wang | .................... | F04D 29/582 165/122 |
| 7,772,712 B2 * | 8/2010 | Frayne | ...................... | F03B 5/00 290/1 R |
| 8,520,384 B2 * | 8/2013 | Park | ........................ | F21V 29/02 165/121 |
| 2009/0044927 A1 * | 2/2009 | Hwang | ............... | F28D 15/0233 165/80.3 |
| 2011/0063800 A1 | 3/2011 | Park | | |
| 2013/0183154 A1 * | 7/2013 | Lucas | ..................... | F04D 33/00 416/144 |
| 2014/0203425 A1 * | 7/2014 | Huang | .................... | H01L 24/97 257/712 |

FOREIGN PATENT DOCUMENTS

| | | |
|---|---|---|
| CN | 101370373 A | 2/2009 |
| TW | 200910054 A | 3/2009 |

* cited by examiner

*Primary Examiner* — Lionel Nouketcha
(74) *Attorney, Agent, or Firm* — Muncy, Geissler, Olds & Lowe, P.C.

(57) ABSTRACT

A heat dissipation device is applied to an electronic device and comprises a heat conduction plate, at least an induction coil and a first heat dissipation plate. The heat conduction plate receives the heat provided by a heat source and includes a first contact element disposed on a first surface of the heat conduction plate. The induction coil is disposed at the heat conduction plate. The first heat dissipation plate is disposed at the first contact element of the heat conduction plate. The first heat dissipation plate and the heat conduction plate form a gap. The first heat dissipation plate includes at least a first magnetic element disposed opposite the induction coil.

8 Claims, 8 Drawing Sheets

HEAT DISSIPATION DEVICE

CROSS REFERENCE TO RELATED APPLICATIONS

This Non-provisional application claims priority under 35 U.S.C. § 119(a) on Patent Application No(s). 103129814 filed in Taiwan, Republic of China on Aug. 29, 2014, the entire contents of which are hereby incorporated by reference.

BACKGROUND OF THE INVENTION

Field of Invention

The invention relates to a heat dissipation device.

Related Art

A conventional heat dissipation method of an electronic device can be roughly divided into two kinds. One is to use a fan in cooperation with a heat dissipation module, and the other is to use an air pump in cooperation with a heat sink.

In the above former case, the heat of a heat source is transmitted to the heat dissipation fins at the fan outlet through a heat conduction material and then discharged outside the electronic device by the fan's operation. In the latter case, the heat of the heat source is transmitted to the heat sink, and then the reciprocating vibration of the air pump drives the airflow passing through the heat dissipation device to achieve the heat dissipation.

However, the above-mentioned heat dissipation methods both can't meet the heat dissipation requirement of the thinned electronic device. As to the case of the fan in cooperation with the heat dissipation module, if it is applied to the thinned electronic device, the fan needs to be thinned also, and the flow and the heat dissipation ability will be thus reduced. Therefore, the heat dissipation efficiency of the thinned fan can not meet the practical requirement. As to the case of the air pump in cooperation with the heat sink, the thinness is an insoluble problem. In addition to a certain height and thickness for the heat sink, the complicated structure inside the heat sink is also a problem for the miniaturization and thinness.

Therefore, it is an important subject to provide a heat dissipation device which can be applied to a thinned electronic device to solve the above-mentioned problems.

SUMMARY OF THE INVENTION

In view of the foregoing subject, an objective of the invention is to provide a heat dissipation device which can be applied to a thinned electronic device.

To achieve the above objective, a heat dissipation device of this invention is applied to an electronic device and comprises a heat conduction plate, at least an induction coil and a first heat dissipation plate. The heat conduction plate receives the heat provided by a heat source and includes a first contact element disposed on a first surface of the heat conduction plate. The induction coil is disposed at the heat conduction plate. The first heat dissipation plate is disposed at the first contact element of the heat conduction plate. The first heat dissipation plate and the heat conduction plate form a gap. The first heat dissipation plate includes at least a first magnetic element disposed opposite the induction coil.

In one embodiment, the induction coil and the first magnetic element have the same quantity.

In one embodiment, the first contact element and the heat conduction plate are integrated into a single piece.

In one embodiment, the heat conduction plate is an uneven plate.

In one embodiment, the heat dissipation device further comprises a second heat dissipation plate. The heat conduction plate includes a second contact element at a second surface that is opposite to the first surface, the second heat dissipation plate is disposed at the second contact element, and the second heat dissipation plate and the heat conduction plate form a gap.

In one embodiment, the second heat dissipation plate includes at least a second magnetic element disposed opposite the induction coil.

In one embodiment, the first magnetic element and second magnetic element corresponding to the same induction coil have the same magnetic property.

In one embodiment, the first magnetic element and second magnetic element corresponding to the same induction coil have opposite magnetic properties.

In one embodiment, the heat source is a heat pipe, and the heat conduction plate is connected to at least a part of the heat pipe to receive the heat provided by the heat pipe.

In one embodiment, the heat conduction plate includes a plurality of heat dissipation fins. The heat dissipation fins are disposed on the first surface of the heat conduction plate or on a second surface that is opposite to the first surface. The first heat dissipation plate further includes at least a through hole, and the heat dissipation fins pass through the through hole.

To achieve the above objective, a heat dissipation device of this invention is applied to an electronic device and comprises a heat conduction plate, a coil base and a heat dissipation plate. The heat conduction plate receives the heat provided by a heat source. The coil base is disposed at the heat conduction plate and configured with at least an induction coil and a contact element disposed on a surface of the coil base. The heat dissipation plate is disposed at the contact element of the coil base. The heat dissipation plate and the coil base form a gap. The heat dissipation plate includes at least a magnetic element disposed opposite the induction coil.

In one embodiment, the coil base is made by a non-conducting material.

In one embodiment, the induction coil and the magnetic element have the same quantity.

In one embodiment, the contact element and the coil base are integrated into a single piece.

In one embodiment, the coil base is an uneven plate.

In one embodiment, the heat source is a heat pipe, and the heat conduction plate is connected to at least a part of the heat pipe to receive the heat provided by the heat pipe.

In one embodiment, the heat conduction plate includes a plurality of heat dissipation fins.

In one embodiment, the coil base further includes at least a cut, and the heat dissipation fins pass through the cut.

Accordingly, in the heat dissipation device of the invention, the induction coils are electrified to attract the magnetic elements at different times. Thereby, the heat dissipation plate will do a swing motion to generate an airflow so that the heat dissipation of the heat conduction plate can be accelerated. Through such disposition, the conventional fan or heat sink can be avoided, and the heat dissipation device of this invention can be applied to the thinned electronic device.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

Figure 1:
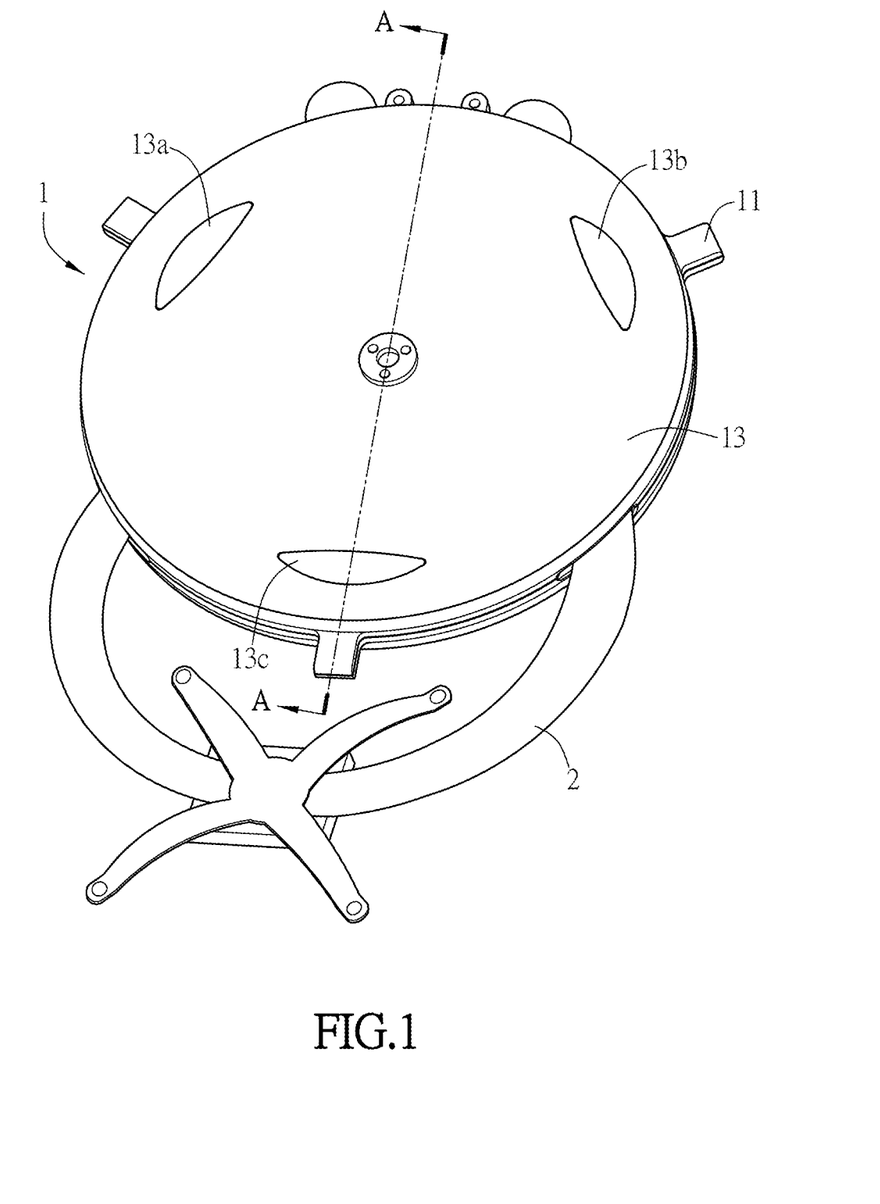
FIG. 1 is a schematic diagram of a heat dissipation device of the first embodiment of the invention.
Figure 2:
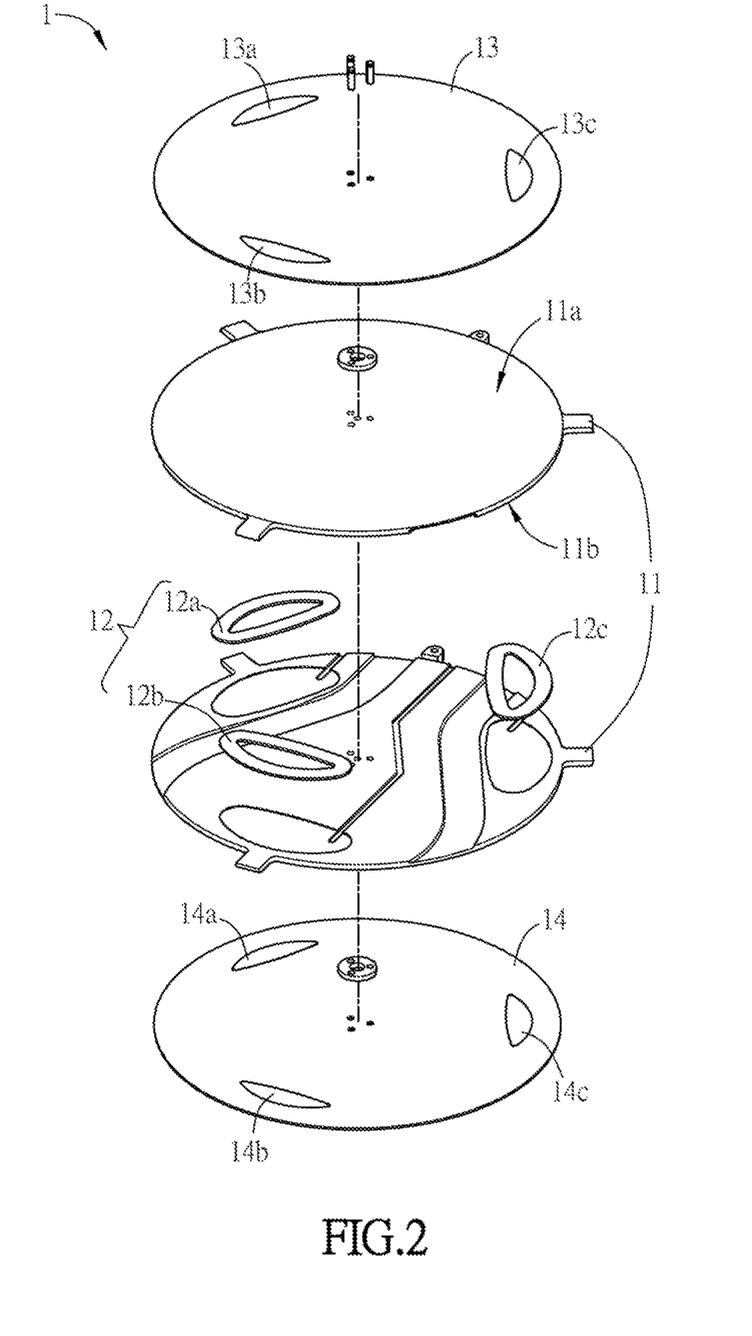
FIG. 2 is a schematic exploded diagram of the heat dissipation device of the first embodiment of the invention.
Figure 3:
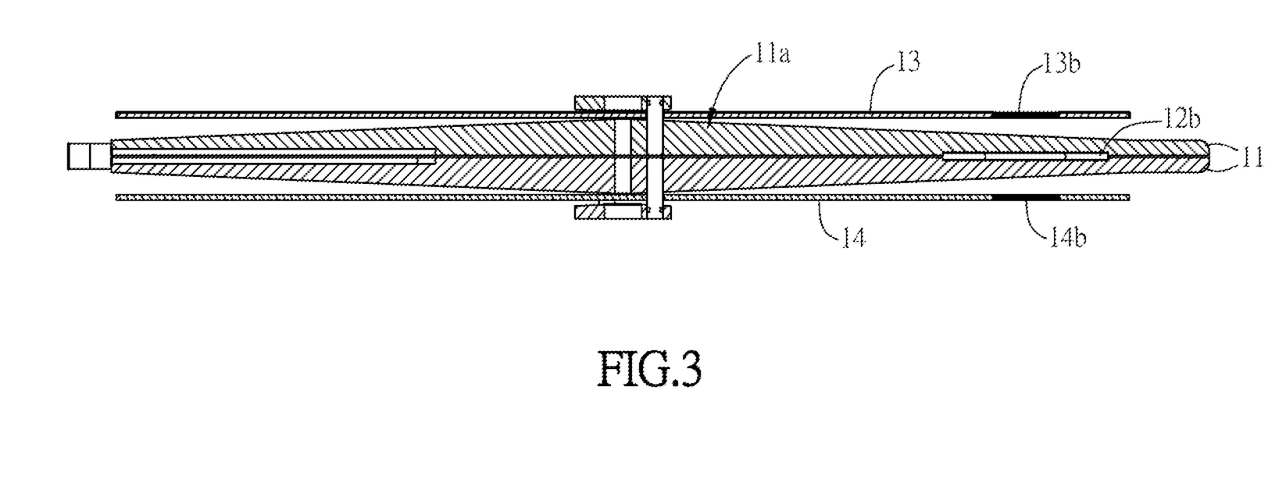
FIG. 3 is a schematic sectional diagram of the heat dissipation device taken along the line AA in FIG. 1.

FIG. 1 is a schematic diagram of a heat dissipation device of the first embodiment of the invention, FIG. 2 is a schematic exploded diagram of the heat dissipation device of the first embodiment of the invention, and FIG. 3 is a schematic sectional diagram of the heat dissipation device taken along the line AA in FIG. 1.

As shown in FIGS. 1, 2 and 3, the heat dissipation device 1 can be applied to an electronic device, and includes a heat conduction plate 11, at least an induction coil 12 and a first dissipation plate 13.

The heat conduction plate 11 can receive the heat provided by a heat source. The heat source of this embodiment is a heat pipe 2, and the heat conduction plate 11 is connected to at least a part of the heat pipe 2 to receive the heat provided by the heat pipe 2. Moreover, the heat conduction plate 11 of this embodiment can be made by heat conduction material, such as copper, aluminum or other good conduction materials.

In this embodiment, the heat conduction plate 11 is composed of two plates, and each of the plates has a varied thickness. From the figures, each of the plates is a cone-like plate with a larger thickness at the center and a smaller thickness at the edge. Through such configuration, the first heat dissipation plate 13 can be supported on the heat conduction plate 11 and an uneven gap can be formed between the first heat dissipation plate 13 and the heat conduction plate 11.

The heat dissipation device of this embodiment further includes a second heat dissipation plate 14, which is disposed at the bulged center of the heat conduction plate 11 and faces the second surface 11b that is opposite to the first surface 11a (the first heat dissipation plate 13 and the second heat dissipation plate 14 are symmetrically disposed on the two sides of the heat conduction plate 11). Likewise, the second heat dissipation plate 14 can be supported on the heat conduction plate 11 and an uneven gap can be formed between the second heat dissipation plate 14 and the heat conduction plate 11.

In other embodiments, the first surface 11a and second surface 11b of the heat conduction plate 11 can be further configured with a first contact element and a second contact element, respectively, and the first heat dissipation plate 13 and the second heat dissipation plate 14 are disposed at the first contact element and the second contact element of the heat conduction plate 11, respectively. Hence, the effect similar to the above-mentioned embodiment also can be achieved. In this embodiment, the contact element and the heat conduction plate also can be regarded as a whole single component.

As shown in FIGS. 1 to 3, at least an induction coil 12 of this embodiment is disposed at the heat conduction plate 11. Further, at least an induction coil 12 can be disposed adjacent to the edge of the heat conduction plate 11.

The first heat dissipation plate 13 includes at least a first magnetic element and the second heat dissipation plate 14 includes at least a second magnetic element. The first and second magnetic elements are both disposed opposite the induction coil 12. Herein for example, the magnetic element of this embodiment can be a magnet and the quantity thereof is six (each of the heat dissipation plates includes three magnets), and there are also three induction coils. The induction coils of this embodiment are evenly disposed on the heat conduction plate 11, and besides, any two of the three induction coils 12a, 12b, 12c have an included angle of 120°. In another embodiment including an even number of induction coils (e.g. two induction coils), the induction coils are disposed symmetrically.

Although this embodiment shows the induction coils and the magnetic elements have the same quantity, they also may have different quantity in other embodiments. For example, the quantity of the induction coils is more than that of the magnetic elements, but the effect similar to this embodiment also can be achieved.

The induction coil can be electrified through a control circuit (not shown) to generate attraction or repulsion, and therefore the first or second magnetic element can receive the attraction or repulsion to drive the first heat dissipation plate 13 to do a swing motion. Moreover, the control method of the control circuit of this embodiment is to attract one of the magnetic elements and repel the other magnetic elements, so that the attracted magnetic element is changed at different times (different swing motions). For example, the S poles of the first magnetic elements 13a, 13b, 13c all face the heat conduction plate 11, and the side, facing the first magnetic elements 13a, 13b, 13c, of the induction coil 12a will become N pole when electrified by the control circuit, and the sides, facing the first magnetic elements 13a, 13b, 13c, of the induction coils 12b, 12c will become S poles when electrified by the control circuit. In this case, the first magnetic element 13a will be attracted and the first magnetic elements 13b, 13c will be repelled. Through the method of switching the current of the induction coils at different times to attract the different first magnetic elements, the first heat dissipation plate 13 can do a periodic swing motion, which will destroy the thermal boundary layer of the heat conduction plate 11. Therefore, the heated air existing in the gap between the heat conduction plate 11 and the first heat dissipation plate 13 will be discharged and the heat dissipation can be accelerated.

Furthermore, in this embodiment, the first magnetic element and second magnetic element corresponding to the same induction coil have the same magnetic property. For example, the S poles of the first magnetic element 13a and second magnetic element 14a both face the heat conduction plate 11, so the second magnetic element 14a is repelled when the first magnetic element 13a is attracted, and therefore the first heat dissipation plate 13 and the second heat dissipation plate 14 can do different swing motions. However, this invention is not limited thereto. In another embodiment, the first magnetic element and the second magnetic element may have opposite magnetic properties.

Thereby, this embodiment can achieve similar heat dissipation efficiency to the conventional heat dissipation fan but just with about 40% of the size of the conventional heat dissipation fan. Therefore, with the same heat dissipation efficiency, this embodiment is more suitable to be applied to the thinned appliance or electronic device.

To be noted, the control circuit of this embodiment can include a full-bridge converter and a driver. The converter includes three or more (the quantity is a multiple of three) bridge arms, and each of the bridge arms is composed of an up switch and a down switch. The driver can supply a driving signal to each switch of the converter to control the turn-on or turn-off of the switches to further control the current magnitude, direction and sequence applied to the induction coils for generating the above-mentioned magnitude and sequence of the coil magnetomotive force. The driver can be an IC of MCU, Dsp, ASIC, FPGA or LPGA. The input type of the voltage can be a sequential square, triangular, sine or sine-like wave, or a PWM voltage. The width of the above PWM voltage can be changed or fixed with time.

Figure 4:
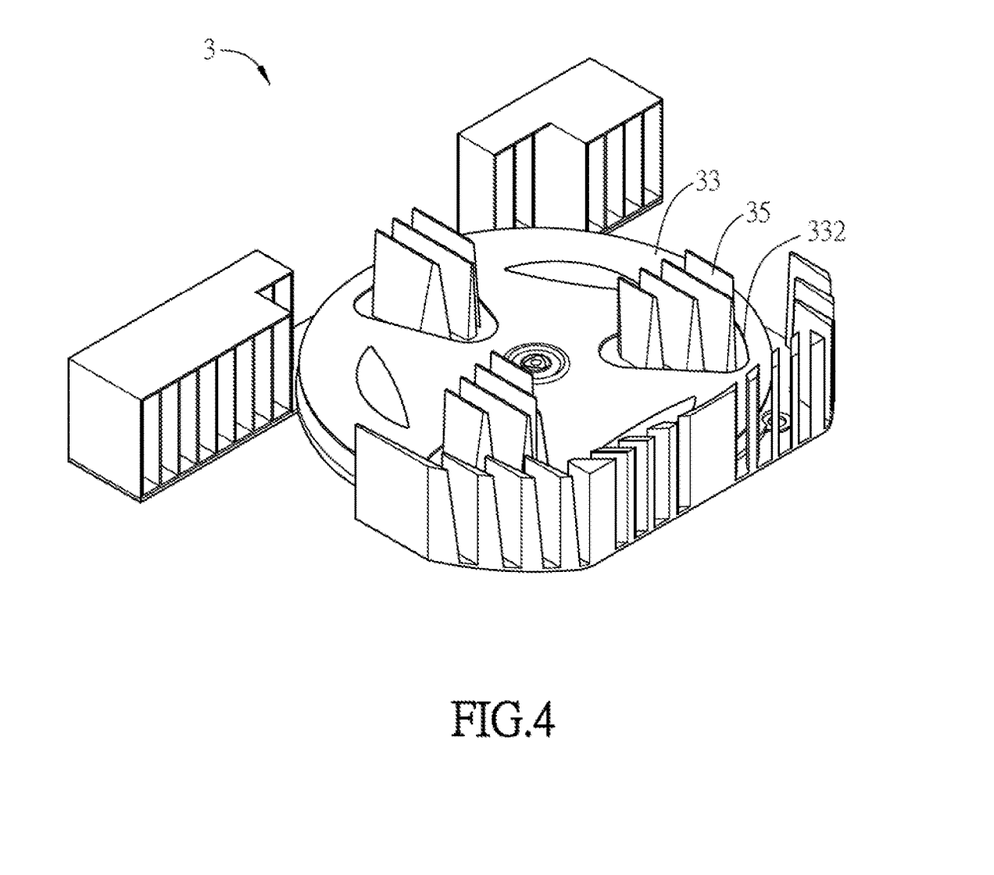
FIG. 4 is a schematic diagram of a heat dissipation device of the second embodiment of the invention.
Figure 5:
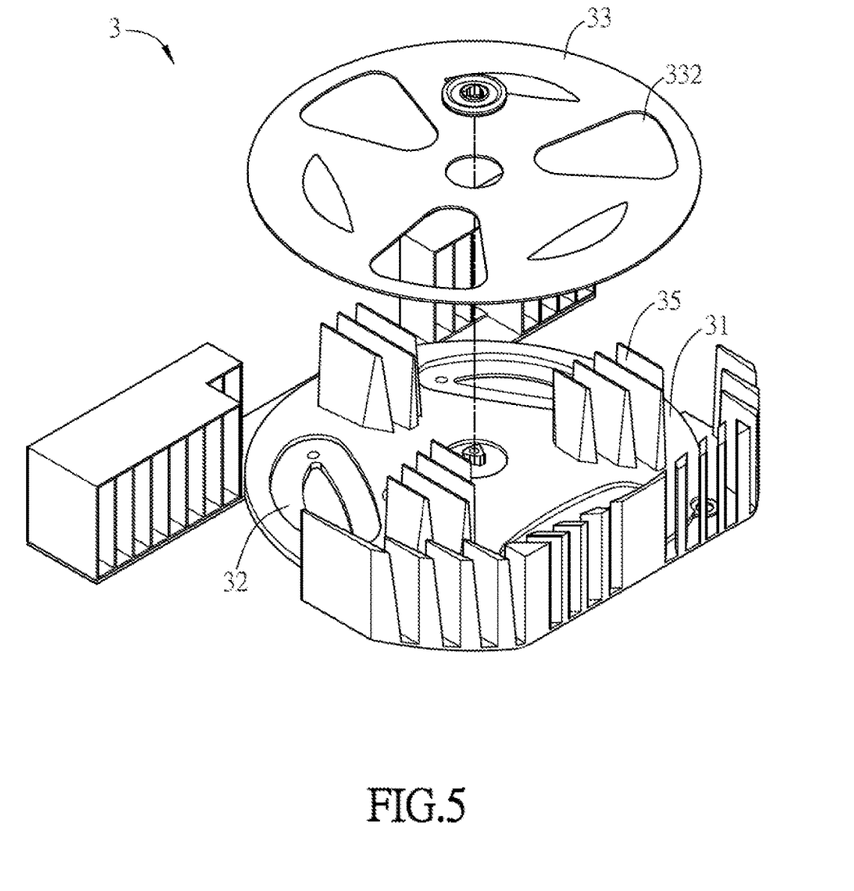
FIG. 5 is a schematic exploded diagram of the heat dissipation device in FIG. 4.

FIG. 4 is a schematic diagram of a heat dissipation device of the second embodiment of the invention, and FIG. 5 is a schematic exploded diagram of the heat dissipation device in FIG. 4.

As shown in FIGS. 4 and 5, the heat dissipation device 3 of this embodiment includes a heat conduction plate 31, at least a induction coil 32 and a first heat dissipation plate 33. The main difference from the above embodiment is that the heat conduction plate 31 of this embodiment includes a plurality of heat dissipation fins 35 for increasing the entire heat dissipation area and efficiency. The heat dissipation fins 35 are disposed on the first surface of the heat conduction plate 31, but the heat dissipation fins of other embodiments may be disposed on the second surface of the heat conduction plate or on the first and second surfaces of the heat conduction plate. The position of the heat dissipation fins can be adjusted according to the product requirement or space.

The heat dissipation fins 35 of this embodiment are disposed on the first surface of the heat conduction plate 31. The first heat dissipation plate 33 further includes at least a through hole 332, and the heat dissipation fins 35 pass through the through hole 332. The purpose of the through holes 332 is to prevent the heat dissipation fins 35 from affecting the swing motion of the heat conduction plate 31. Therefore, the position and quantity of the through holes 332 can be adjusted according to the requirements.

Since other elements and their disposition are similar to the above embodiment, the related illustration is omitted here for conciseness.

Figure 6:
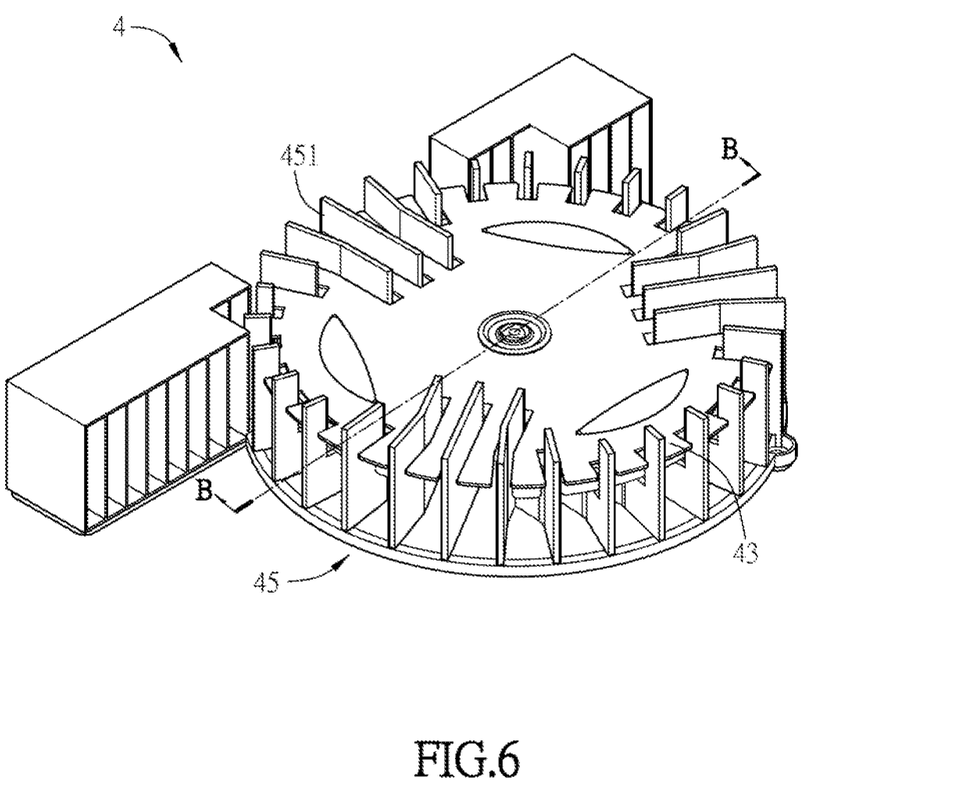
FIG. 6 is a schematic diagram of a heat dissipation device of the third embodiment of the invention.
Figure 7:
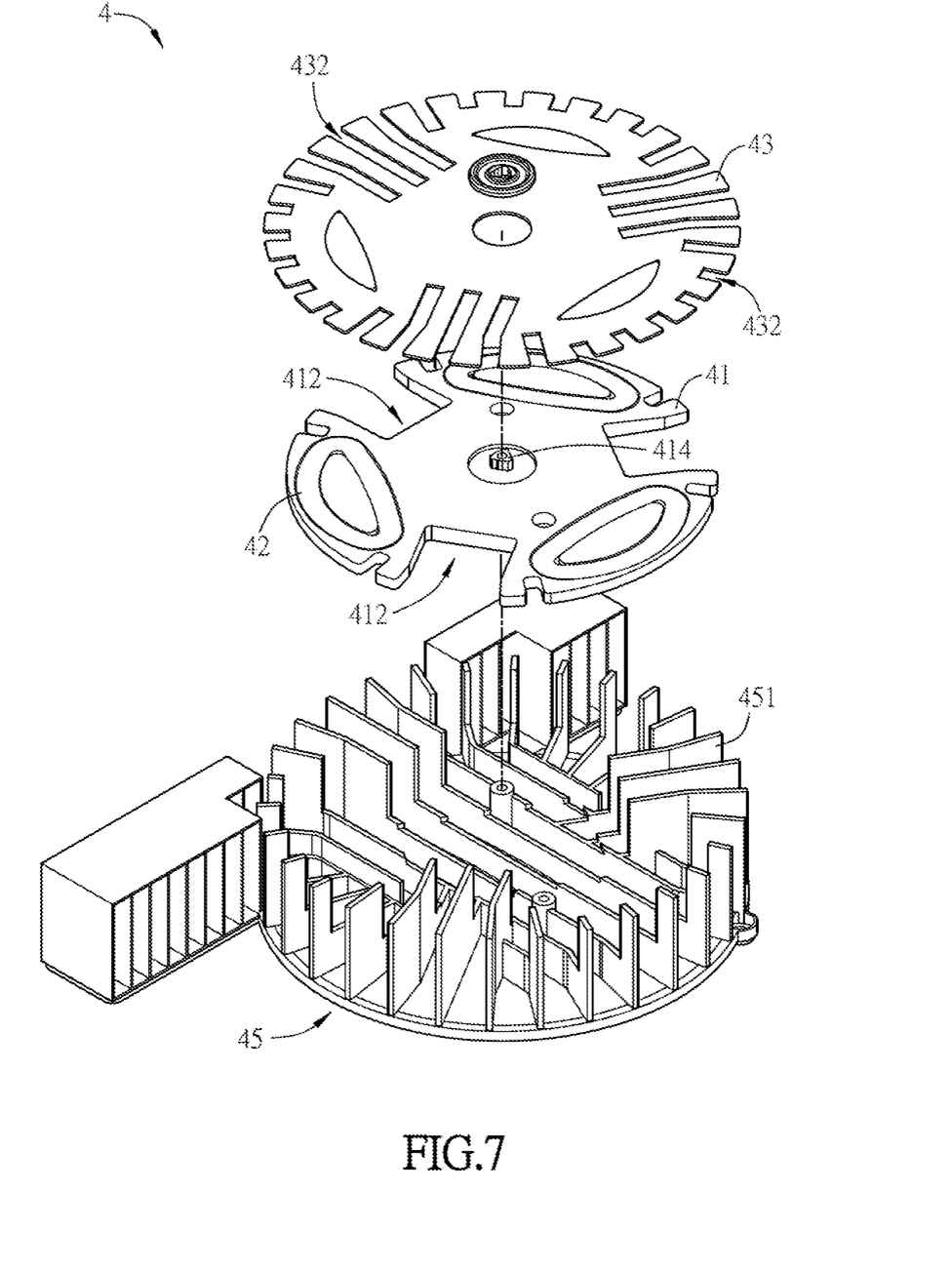
FIG. 7 is a schematic exploded diagram of the heat dissipation device of the third embodiment of the invention.
Figure 8:
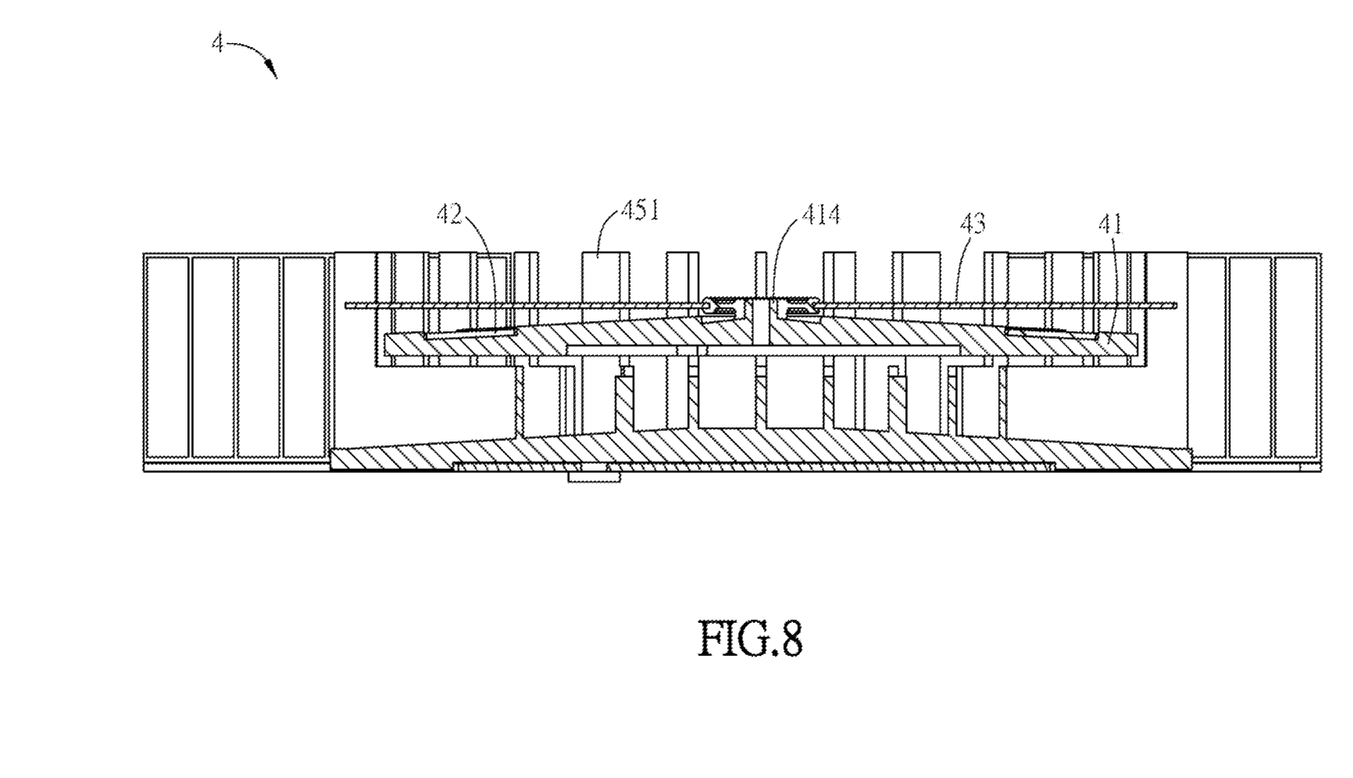
FIG. 8 is a schematic sectional diagram of the heat dissipation device taken along the line BB in FIG. 6.

FIG. 6 is a schematic diagram of a heat dissipation device of the third embodiment of the invention, FIG. 7 is a schematic exploded diagram of the heat dissipation device of the third embodiment of the invention, and FIG. 8 is a schematic sectional diagram of the heat dissipation device taken along the line BB in FIG. 6.

As shown in FIGS. 6 to 8, the heat dissipation device 4 of this embodiment includes a heat conduction plate 45, a coil base 41 and a heat dissipation plate 43. The heat conduction plate 45 includes a plurality of heat dissipation fins 451. The heat dissipation fins 451 of this embodiment form a base to hold the coil base 41. The disposition of the heat dissipation fins 451 also can increase the entire heat dissipation area and efficiency. The shape and position of the heat dissipation fins 451 can be adjusted according to the product requirement or space.

The coil base 41 is an uneven plate and disposed at the heat conduction plate 45. The coil base 41 is configured with at least an induction coil 42 and a contact element 414, and the contact element 414 is disposed on a surface of the coil base 41. Moreover, the contact element 414 and the coil base 41 can be integrated into a single piece. To be noted, the contact element 414 is disposed at the coil base 41 in this embodiment, which is different from the above embodiment where the contact element is disposed on the surface of the heat conduction plate 11.

In order to prevent the heat generated by the induction coil 42 from being transmitted to the heat dissipation plate 43 to affect the heat dissipation efficiency, the coil base 41 can be made by a non-conducting material to support the induction coil. Further, the coil base 41 can be insulated against the heat generated by the induction coil 42 during the operational process, so that the generated heat won't be transmitted to the heat dissipation plate 43.

The heat dissipation plate 43 is disposed at the contact element 414 of the coil base 41. The heat dissipation plate 43 and the coil base 41 form a gap. The heat dissipation plate 43 includes at least a magnetic element disposed opposite the induction coil 42. Moreover, the quantity of the induction coil 42 in this embodiment is the same as that of the magnetic element.

The heat dissipation plate 43 of this embodiment further includes at least a through hole 432. The through holes 432 are disposed at the edge of the heat dissipation plate 43. The coil base 41 of this embodiment includes at least a cut 412. The cuts 412 and the through holes 432 are disposed corresponding to the heat dissipation fins 451, and the heat dissipation fins 451 pass through the cuts 412 and the through holes 432. The disposition of the cuts 412 and through holes 432 can prevent the heat dissipation fins 451 from affecting the swing motion of the heat dissipation plate 43. Therefore, the position and quantity of the cuts 412 and through holes 432 can be adjusted according to the requirements.

Since other elements and their disposition are similar to the above embodiment, the related illustration is omitted here for conciseness.

Accordingly, in the heat dissipation device of the invention, the induction coils are electrified to attract the magnetic elements at different times. Thereby, the heat dissipation plate will do a swing motion to generate an airflow so that the heat dissipation of the heat conduction plate can be accelerated. Through such disposition, the conventional fan or heat sink can be avoided, and the heat dissipation device of this invention can be applied to the thinned electronic device.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A heat dissipation device, comprising:
   a heat conduction plate receiving heat provided by a heat source, wherein the heat conduction plate includes a first contact element disposed on a first surface of the heat conduction plate;

a plurality of induction coils disposed at the periphery of the heat conduction plate; and a first heat dissipation plate disposed at the first contact element of the heat conduction plate, wherein the first heat dissipation plate and the heat conduction plate form a gap, the first heat dissipation plate includes a plurality of first magnetic elements disposed at the periphery of the first heat dissipation plate, opposite the induction coils;

wherein currents of the induction coils are configured to switch at different times to attract one of the first magnetic elements above one of the induction coils and to repel the other one of the first magnetic elements above the other one of the induction coils, so that the first heat dissipation plate undergo a periodic swing motion in the up and down direction with respect to the center axis of the device to destroy a thermal boundary layer of the heat conduction plate.

2. The heat dissipation device as recited in claim 1, wherein the plurality of the induction coils and the plurality of the first magnetic elements have the same quantity.

3. The heat dissipation device as recited in claim 1, wherein the first contact element and the heat conduction plate are integrated into a single piece.

4. The heat dissipation device as recited in claim 1, wherein the heat conduction plate further comprises:

a second heat dissipation plate, wherein the heat conduction plate includes a second contact element at a second surface that is opposite to the first surface, the second heat dissipation plate is disposed at the second contact element, and the second heat dissipation plate and the heat conduction plate form a gap.

5. The heat dissipation device as recited in claim 4, wherein the second heat dissipation plate includes at least a second magnetic element disposed opposite the induction coils.

6. The heat dissipation device as recited in claim 5, wherein one first magnetic element of the first magnetic elements and the second magnetic element corresponding to the same coil of the induction coils respectively have a first magnetic property and a second magnetic property, and the first magnetic property and the second magnetic property are the same.

7. The heat dissipation device as recited in claim 5, wherein one first magnetic element of the first magnetic elements and the second magnetic element corresponding to the same coil of the induction coils respectively have a first magnetic property and a second magnetic property, and the first magnetic property and the second magnetic property are opposite to each other.

8. The heat dissipation device as recited in claim 1, wherein the heat source is a heat pipe, and the heat conduction plate is connected to at least a part of the heat pipe to receive the heat provided by the heat pipe.

* * * * *